United States Patent [19]
Cho

[11] Patent Number: 5,893,980
[45] Date of Patent: Apr. 13, 1999

[54] SEMICONDUCTOR DEVICE CAPACITOR FABRICATION METHOD

[75] Inventor: Bok-Won Cho, Cheongju, Rep. of Korea

[73] Assignee: LG Semicon Co., Ltd., Choongcheongbuk-Do, Rep. of Korea

[21] Appl. No.: 08/772,848

[22] Filed: Dec. 24, 1996

[30] Foreign Application Priority Data

Dec. 30, 1995 [KR] Rep. of Korea ............ 95-68653

[51] Int. Cl.[6] ............... C23F 1/00; H05K 1/00
[52] U.S. Cl. ............... 216/2; 216/6; 216/17; 216/19; 437/50; 437/52; 437/180; 437/203; 437/225
[58] Field of Search ............... 437/50, 52, 180, 437/203, 225; 216/2, 6, 17, 19

[56] References Cited

U.S. PATENT DOCUMENTS

| | | |
|---|---|---|
| 5,047,817 | 9/1991 | Wakamiya et al. |
| 5,140,389 | 8/1992 | Kimura et al. |
| 5,324,679 | 6/1994 | Kim et al. ............ 437/52 |
| 5,442,213 | 8/1995 | Okudaira et al. ............ 257/310 |
| 5,534,458 | 7/1996 | Okudaira et al. ............ 437/60 |
| 5,652,186 | 7/1997 | Okudaira et al. ............ 437/189 |
| 5,668,041 | 9/1997 | Okudaira et al. ............ 437/60 |
| 5,670,408 | 9/1997 | Yamamichi et al. ............ 437/47 |
| 5,683,929 | 11/1997 | Ohi et al. ............ 437/47 |

*Primary Examiner*—Christopher L. Chin
*Attorney, Agent, or Firm*—Birch, Stewart, Kolasch & Birch, LLP

[57] ABSTRACT

A semiconductor device capacitor fabrication method comprises forming a first insulation film on a substrate and an undoped semiconductor layer on the first insulation film, patterning the undoped semiconductor layer to a desired shape, forming a second insulation film on the undoped semiconductor layer, forming contact holes by selectively etching the second insulation film, the undoped semiconductor layer and the first insulation respectively for exposing a portion of the undoped semiconductor layer therethrough, forming a first electrode film on the bottom of each of the contact holes, the undoped semiconductor layer and side walls of the second insulation film, removing the second insulation film, and forming a dielectric thin film and a second electrode film sequentially on the first electrode film. The fabrication method realizes a high dielectric constant in a large scale integration semiconductor memory device by employing new materials for a dielectric thin film and an electrode.

20 Claims, 5 Drawing Sheets

SEMICONDUCTOR DEVICE CAPACITOR FABRICATION METHOD

BACKGROUND OF THE INVENTION

1. Field of the Invention

The present invention relates to a semiconductor device capacitor, and more particularly to a semiconductor device capacitor fabrication method for obtaining a high dielectric constant in a large scale integration (LSI) semiconductor memory device by applying new materials to a dielectric thin film and an electrode.

2. Description of the Prior Art

With reference to a conventional semiconductor device capacitor, as shown in FIG. 1, there is provided a substrate 1 having a plurality of impurity diffusion regions 2 therein. An oxide film 3 is formed on the substrate 1 and then etched by a lithographic technique to pattern a plurality of contact holes therethrough. A polysilicon layer 8 is formed in the contact holes and on the oxide film 3 and then patterned. A dielectric thin film 9 is formed on the patterned dielectric thin fill 9 conductive layer 10 serving as an upper electrode of the capacitor is formed on the dielectric film 9.

As semiconductor memory devices become increasingly integrated, the size of memory cells gradually decreases and the area occupied by a capacitor in a semiconductor device decreases accordingly. Thus, the dielectric constant $\epsilon_r$ of the dielectric thin film 9 must be increased.

In general, the most compatible dielectric thin film applied to a known semiconductor device fabrication method is $SiO_2$, which unfortunately exhibits a dielectric constant as low as approximately 3.8 $\epsilon_r$. Also, because of limitations in thinning a dielectric film formed of $SiO_2$, the dielectric film must be combined with other films for thereby forming a multi-fold film such as one formed of ONO (Oxide-Nitride-Oxide) or NO (Nitride-Oxide) . However, the NO thin film currently employed in the fields concerned is limited to about 4 nm even after nitridation annealing. Also, the ONO structure is not appropriate for use in an LSI semiconductor device due to the low dielectric constant thereof.

To obtain a higher capacitance in a capacitor formed by applying thereto an NO layer having a limited thickness, a three-dimensional capacitor instead of a planar type capacitor is required. Therefore, layers must be stacked on a substrate or the substrate must be dug down into to form the layers therein. In this way, the effective area for a three-dimensional capacitor can be increased. However, the fabrication process can be complicated, and although a low dielectric constant in an ONO thin film leads to a larger integration, the ONO structure may face limits because of the complicated ONO structure.

In recent years, various approached have been suggested for overcoming the above-described obstacles.

For instance, one approach is focused on a storage node fabrication method using so-called HSG (Hemisphere Grain)—Si for increasing the effective capacitor area in a capacitor which is limited under design rules, structural aspects and so forth. This approach changes a CVD (chemical vapor deposition) silicon surface used as a storage node into a rugged morphology instead of into a smooth one.

Another approach is directed to forming a capacitor dielectric thin film having a high dielectric constant such as $Ta_2O_5$ ($\epsilon_r$=2.4) or $BST(Ba_xSr_{1-x}TiO_3)$ ($\epsilon_r$=300). However, such technology is difficult to apply in practice because of the sudden decrease of dielectric constant and increased leakage current.

A material $Ta_2O_5$ and gaseous $O_2$ serving as a source of Ta, $Ta(OC_2H_5)_5$ (penta-ethoxy-tantalum) are employed to form a thin film by simultaneous injection so as to produce an oxide film using a technique such as LPCVD (low-pressure chemical vapor deposition), RF-PECVD or ECR-PECVD.

The dielectric constant of $Ta_2O_5$ ($\epsilon_r$=22~28) is six times higher than that of $SiO_2$ and because its leakage current remains low ($10^{-9}$–$10^{-7}$ A/cm$^{-2}$ under an electric field of 4MV/cm$^2$) after an appropriate annealing process, $Ta_2O_5$ can be applied to a large scale integrated memory device capacitor. Yet, when Si is used as a storage node, oxidation of the silicon surface may be inevitable, resulting in the formation of $SiO_2$ film thereon. That is, the annealing process after silicon deposition enables the $SiO_2$ film to grow thicker.

Also, the intermediate $SiO_2$ film leads to lowering the effective dielectric constant of the dielectric thin film, thereby rendering it difficult to easily obtain a desired capacitance.

It is recommended that the surface of a silicon layer serving as a storage node is nitrided prior to the deposition of $Ta_2O_5$ and a silicon nitride film is formed thereon and also $Ta_2O_5$ thin film is deposited thereon. In this case, the properties such as dielectric constant, leakage current or TDDB (Time dependent dielectric breakdown) are reported to be superior to those occurring during non-nitridation. Besides, even when a $Ta_2O_5$ thin film is applied to a dielectric film, the surface of the silicon electrode maintains a rugged morphology to enable an improvement in capacitance of up to 60%. At this time, because the capacitance remains about 12.5 fF/$\mu$m$^{-2}$, the $Ta_2O_5$ thin film can be put to a practical use, assuming that oxide growth does not occur.

However, when a silicon layer is used as a lower electrode in a capacitor, irrespective of the surface shapes, the high capacitance which is unique to $Ta_2O_5$ may not be obtained due to an oxide or nitride film being formed by oxidation or nitridation.

SUMMARY OF THE INVENTION

Therefore, it is an object of the present invention to provide a semiconductor device capacitor fabrication method excluding the use of Si which is not appropriate as a lower electrode for a high dielectric thin film, and obtaining a high dielectric constant by using a refractory metal or a refractory silicide, thereby obtaining a larger effective area in a capacitor.

To achieve the above-described object, the semiconductor device capacitor fabrication method in accordance with the present invention comprises forming a first insulation film on a substrate and an undoped semiconductor layer on the first insulation film, patterning the undoped semiconductor layer to a desired shape, forming a second insulation film on the undoped semiconductor layer, forming contact holes by selectively etching the second insulation film, the undoped semiconductor layer and the first insulation respectively for exposing a portion of the undoped semiconductor layer therethrough, forming a first electrode film on the bottom of each of the contact holes, the undoped semiconductor layer and side walls of the second insulation film, removing the second insulation film, and forming a dielectric thin film and a second electrode film sequentially on the first electrode film.

DETAILED DESCRIPTION OF THE PREFERRED EMBODIMENTS

Referring to FIGS. 2A through 2E, a self-aligned stacked capacitor fabrication method for a semiconductor memory device in accordance with a first embodiment of the present invention will now be described.

Figure 2A:
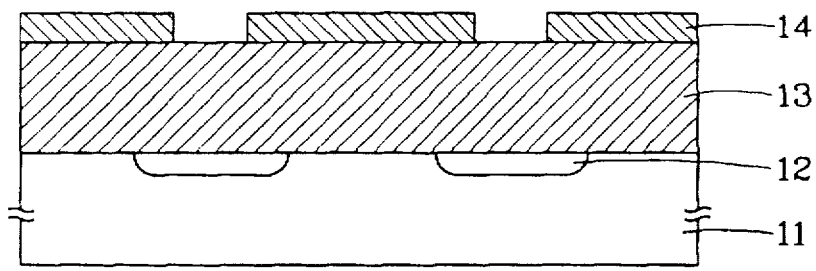
FIGS. 2A through 2E are cross-sectional views showing fabrication steps of a semiconductor capacitor in accordance with a first embodiment of the present invention.

First, as shown in FIG. 2A, there are formed a plurality of impurity diffusion regions 12 in a semiconductor substrate 11. A first insulation film 13 composed of a material such as USG (undoped silicate glass) is formed on the substrate 11. Then, an undoped polysilicon layer 14 is formed on the first insulation film 13. At this time, the thickness of each of the first insulation film 13 and the undoped poly-silicon layer 14 is determined depending on the etch selectivity of the material thereof. Then, the undoped polysilicon layer 14 is patterned by photolithography to selectively expose the surface of the first insulation film 13.

Figure 2B:
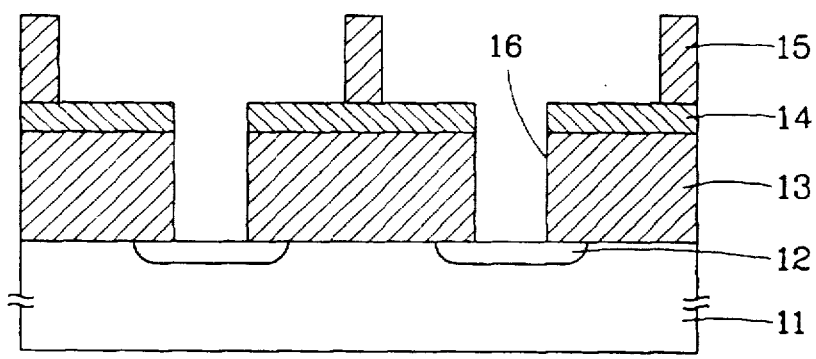

As shown in FIG. 2B, on the undoped poly-silicon layer 14 there is formed a second insulation film 15 composed of a material such as HLD(High temperature Low pressure Dielectric). After patterning the second insulation film 15 by photolithography, the first and second insulation films 13, 15 are selectively removed using a dry etching technique so that surface portions of the undoped poly-silicon layer 14 adjacent to the contact holes can be exposed, whereby a plurality of self-aligned contact holes 16 are formed through the first insulation films 13. At this time, the thickness of each of the second insulation film 15 and the undoped poly-silicon layer 14 is determined depending on the etch selectivity and bit-line/storage-node capacitance (Cb/Cs) of the material thereof.

Figure 2C:
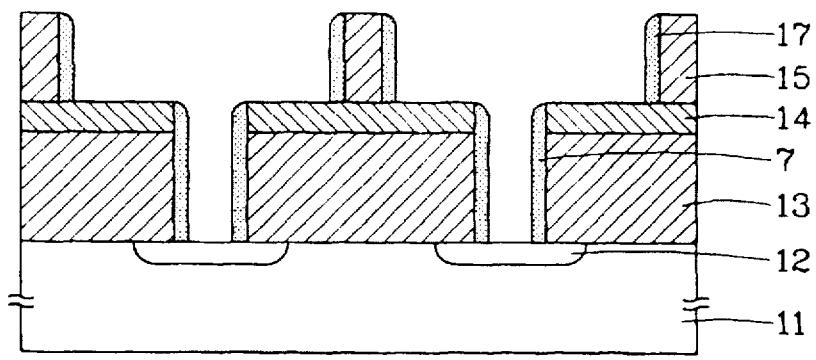

As shown in FIG. 2C, after depositing poly-silicon on the externally exposed substrate 11, the first and second insulation films 13, 15 and the undoped poly-silicon film 14, respectively, an anisotropic dry etching technique is applied to the deposited surface for thus forming poly-side wall spacers 17 on the side walls of the first and second insulation films 13, 15.

Figure 2D:
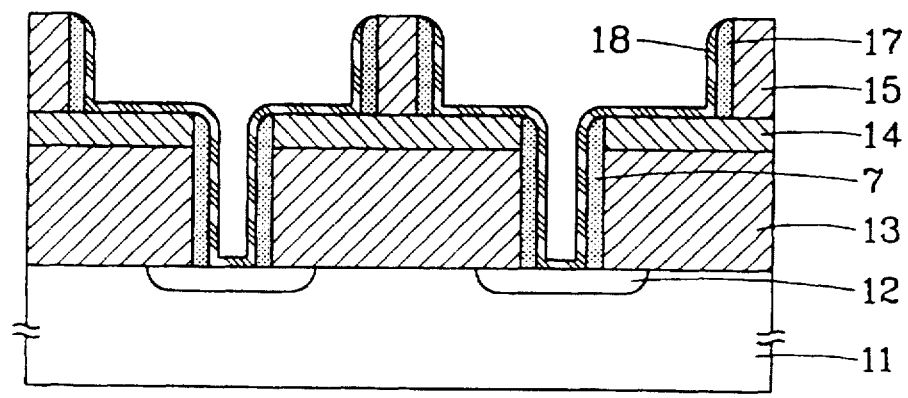

Referring to FIG. 2D, a metallic layer 18 serving as a first electrode is formed on the exposed substrate 11, the side wall spacers 17 and the undoped poly-silicon film 14, respectively. At this time, using an initial time delay during a nucleus generation on the undoped and doped poly silicon films 14, 17 and on the second insulation film 15, there is selectively formed only on the poly-silicon side wall spacers 14, 17 a refractory metal such as W, Ti, Ta or Mo, a metallic silicide such as $WSi_x$, $TiSi_x$ or $TaSi_x$, or a metallic layer formed of one selected from Pt and $RuO_x$.

Figure 2E:
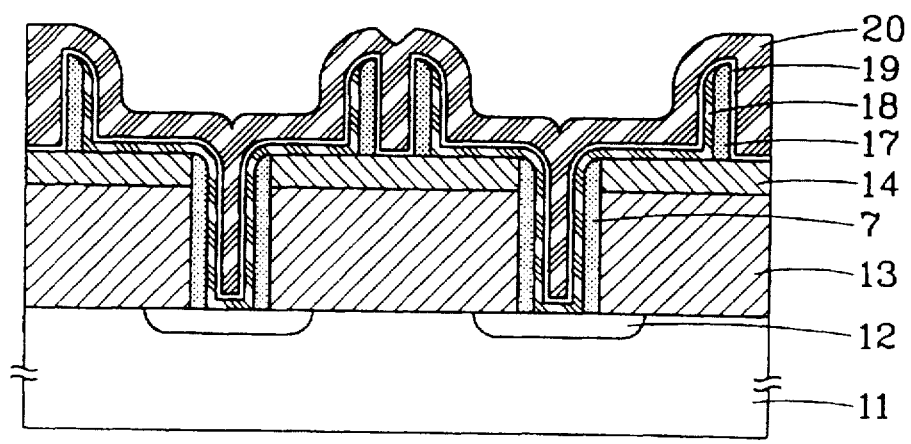

Then, as shown in FIG. 2E, after removing the second insulation film 15 using a dry etching technique, a dielectric thin film 19 (formed of $Ta_2O_5$) is formed on the first electrode film 18 including the surface from which the second insulation film 15 was removed, by means of LPCVD (low-pressure chemical vapor deposition) or PECVD (plasma-enhanced chemical vapor deposition). For the deposition methods, the dielectric thin film 19 adopts $Ta(OC_2H_5)_5$ and $O_2$ as the source thereof and is processed by a two-step annealing (UV-$O_3$ annealing+dry-$O_2$ annealing). At this time, the dielectric thin film 19 can be formed of one selected from $Ba_xSr_{1-x}TiO_3$ and $Pb_xZr_{1-x}TiO_3$.

Finally, on the dielectric thin film 19 there is deposited a refractory metal such as TiN, Ta, W or Mo, or a metallic silicide respectively serving as a second electrode film 20 for an upper electrode.

Figure 1:
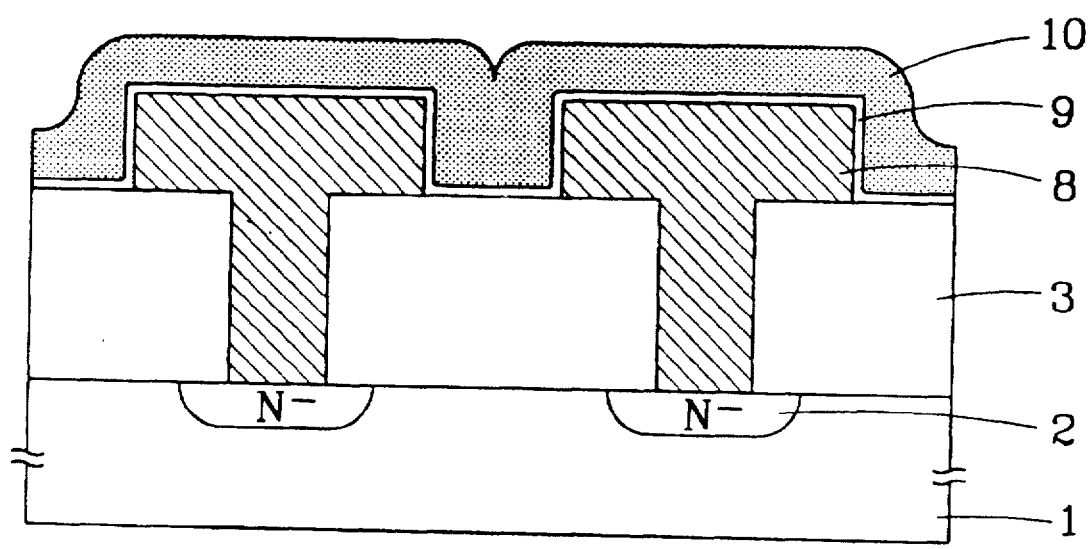
FIG. 1 is a cross-sectional view showing a conventional stacked capacitor structure in a semiconductor device.

The thusly fabricated semiconductor device capacitor serves to obtain an increased effective area therein in comparison to the conventional semiconductor device as shown in FIG. 1 as well as a high dielectric constant by applying $Ta_2O_5$ to a dielectric film and a refractory metal such as W in forming a lower electrode.

With reference to FIGS. 3A through 3D, a semiconductor device capacitor fabrication method in accordance with a second embodiment of the present invention will now be described.

Figure 3A:
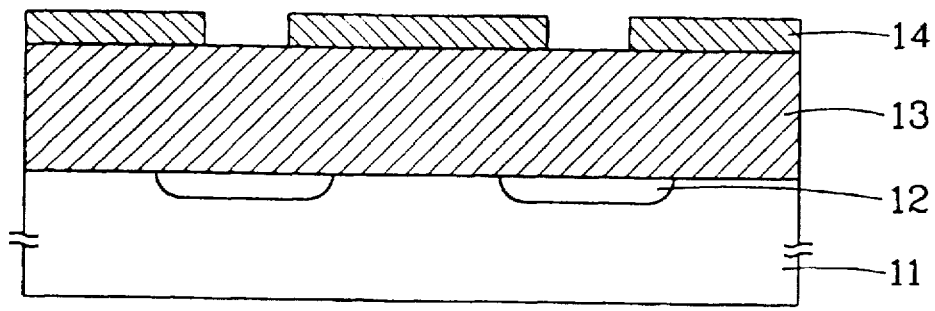
FIGS. 3A through 3D are cross-sectional views showing fabrication steps of a semiconductor capacitor in accordance with a second embodiment of the present invention.
Figure 3B:
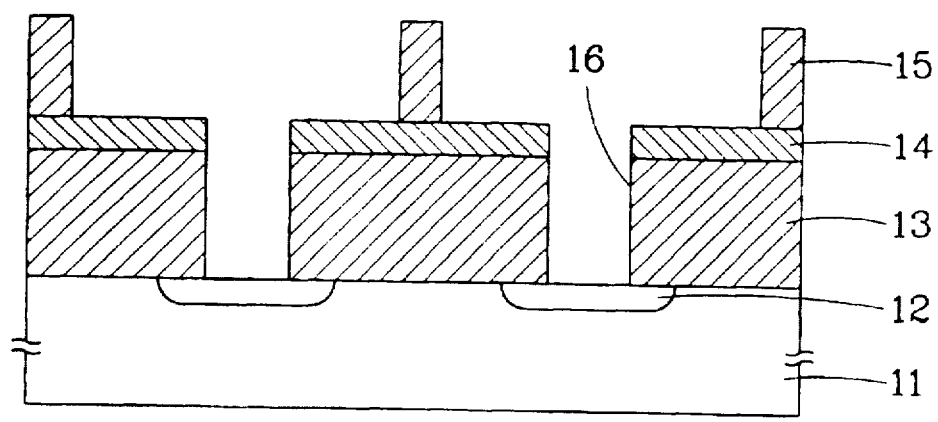

Initially, the fabrication steps shown in FIGS. 3A and 3B are identical to those in FIGS. 2A and 2B and accordingly their descriptions will be omitted.

Figure 3C:
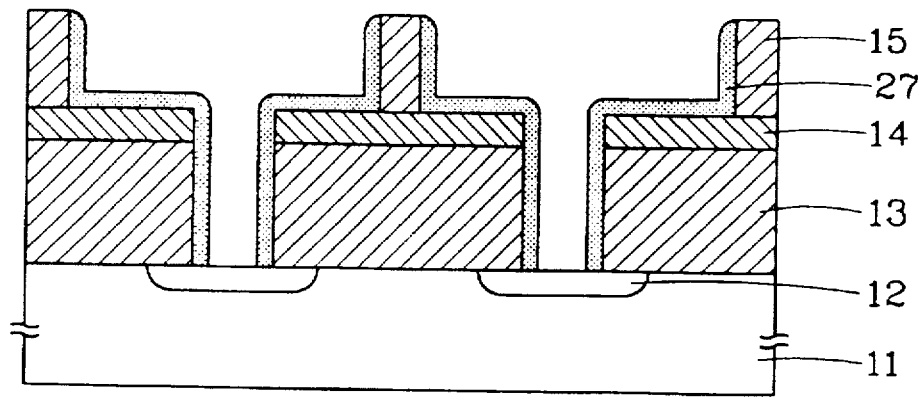

As shown in FIG. 3C, after forming a doped poly-silicon film on the externally exposed substrate 11 and the side walls of each of the first and second insulation films 13, 15, an undoped poly-silicon film 14 and a second insulation film 15, respectively, there is patterned a first electrode film 27 thereon by selectively etching the doped poly-silicon film provided on the externally exposed substrate 11 and the upper surface of the second insulation film 15, respectively.

Then, RTA (rapid thermal annealing) is applied to the patterned poly-silicon film but the remaining second insulation film 15 is removed therefrom by a wet-dip technique, whereby poly-silicon side wall spacers 27 are formed on each side wall of the first and second insulation films 13, 15 and on the undoped poly-silicon film 14.

Figure 3D:
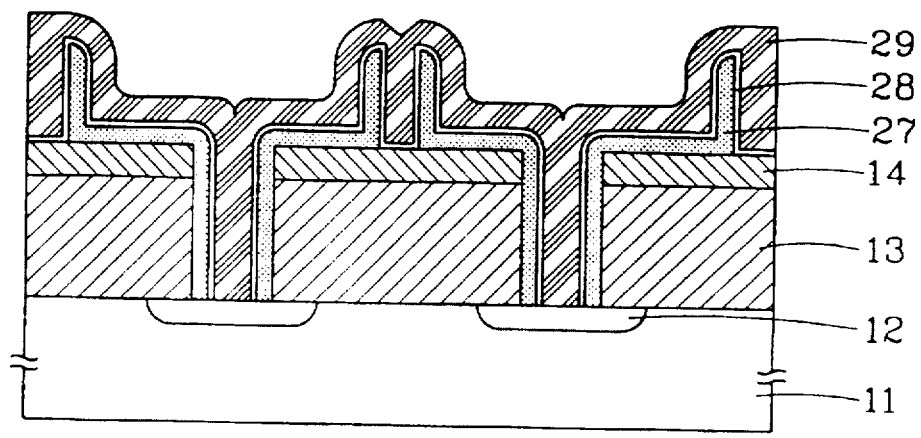

As shown in FIG. 3D, the first electrode film 27 is put under nitridation which is applied thereto for controlling the formation of a native oxide film or an interface silicon oxide film during the forming of dielectric film formed of $Ta_2O_5$. After nitriding the substrate 11, a dielectric thin film 28 (formed of $Ta_2O_5$) is formed on the first electrode film 27, the externally exposed substrate 11 and the surface from which the second insulation film 15 is removed, respectively, by using a technique selected from LPCVD, RF (radio frequency)-PECVD and ECR (electron cyclotron resonance)-PECVD); for the deposition methods, the dielectric thin film 28 adopts $Ta(OC_2H_5)_5$ and $O_2$ as the source thereof and is electrically stabilized by using a technique selected from an $O_2$-plasma annealing and a two-step annealing(UV-$O_3$ annealing+dry-$O_2$ annealing).

Finally, on the dielectric thin film 28 there is deposited a second electrode film 29 serving as an upper electrode in the capacitor, which second electrode film 29 is formed of one selected from TiN, W, Mo and TaN.

As described in the above embodiments, the semiconductor device capacitor fabrication method in accordance with the present invention has the advantage in that the contact holes are formed by self-alignment for thereby simplifying the process steps and facilitating forming the storage node contact holes even when the semiconductor cell is decreased in size.

Further, because the capacitor has a two-bend open structure, the cell isolation therein can be easily realized and also the bottom surface of the contact holes can be applied to a capacitor area by adjusting the thickness of the poly-side wall spacers.

Still further, the nitridated first electrode film has a rugged tungsten morphology for obtaining a larger capacitance. Also, the high etch selectivity between the insulation film and a poly-silicon film during formation of the self-aligned contact holes leads to process facilitation.

The present invention is contrived to be appropriate to forming a dielectric layer formed of $Ta_2O_5$ which is being considered as a capacitor dielectric thin film for a next generation memory device and enables a semiconductor device with a larger capacitance to be fabricated with fewer steps than those for a conventional capacitor.

What is claimed is:

1. A semiconductor device capacitor fabrication method, comprising:

forming a first insulation film on a substrate and an undoped semiconductor layer on the first insulation film;

patterning the undoped semiconductor layer to a desired shape;

forming a second insulation film on the undoped semiconductor layer;

forming a plurality of contact holes by selectively etching the second insulation film, the substrate and the first insulation film, respectively, for thereby exposing a portion of the undoped semiconductor layer therethrough;

forming a first electrode film on a bottom of each of the plurality of contact holes, a surface of the undoped semiconductor layer and side walls of each of the first and second insulation films, respectively;

removing the second insulation film therefrom; and forming a dielectric thin film and a second electrode film sequentially on the first electrode film.

2. The fabrication method of claim 1, further comprising forming a poly-morphic silicon layer on side walls of each of the contact holes, the undoped semiconductor layer and the second insulation film, respectively, the poly-morphic silicon layer being formed before the first electrode film is formed and being positioned between the first electrode film and the side walls of each of the contact holes.

3. The fabrication method of claim 2, further comprising:

rapid thermal annealing (RTA) the poly-morphic silicon layer after the formation thereof, wherein the poly-morphic silicon layer includes a doped poly-morphic silicon layer.

4. The fabrication method of claim 1, wherein the second insulation film is removed by a dry etching process.

5. The fabrication method of claim 1, further comprising:

forming a poly-morphic silicon layer on side walls of each of the contact holes, the undoped semiconductor layer and the second insulation film, respectively, and forming poly-morphic silicon side wall spacers on side walls of each of the contact holes and the second insulation film, respectively, wherein forming the first electrode film comprises selectively forming a conductive layer on the bottom of each of the contact holes, the side walls of the poly-morphic silicon layer and an upper surface of the undoped semiconductor layer, respectively.

6. The fabrication method of claim 5, wherein the conductive layer is formed of one selected from $RuO_x$, a metallic layer and a silicide layer.

7. The fabrication method of claim 6, wherein the metallic layer is formed of one selected from W, Ti, Ta, Pt and Mo.

8. The fabrication method of claim 6, wherein the silicide layer is formed of one selected from $WSi_x$, $TiSi_x$ and $TaSi_x$.

9. The fabrication method of claim 1, wherein the dielectric thin film is formed of one selected from $Ta_2O_5$, $Ba_xSr_{1-x}TiO_3$ and $Pb_xZr_{1-x}TiO_3$.

10. The fabrication method of claim 1, further comprising:

nitriding the first electrode film, forming a $Ta_2O_5$ layer on the nitrided first electrode film, and annealing the $Ta_2O_5$ layer.

11. The fabrication method of claim 10, wherein the $Ta_2O_5$ layer has $Ta(OC_2H_5)_5$ and $O_2$ as the source thereof and is applied by a technique selected from low-pressure chemical vapor deposition, radio-frequency plasma-enhanced chemical vapor deposition, and electron cyclotron resonance plasma-enhanced chemical vapor deposition.

12. The fabrication method of claim 10, wherein the $Ta_2O_5$ layer is annealed using $O_2$-plasma.

13. The fabrication method of claim 10, wherein the $Ta_2O_5$ layer is applied with a dry-$O_2$ annealing after performing a UV-$O_3$ annealing thereof.

14. The fabrication method of claim 1, wherein the second electrode layer is formed of one selected from TiN, W, WMo and TaN.

15. A semiconductor device capacitor fabrication method, comprising:

exposing a portion of a semiconductor substrate by selectively etching a first insulation film, an undoped semiconductor layer and a second insulation film that are positioned above the semiconductor substrate;

forming a first electrode film on the exposed portion of the semiconductor substrate, a surface of the undoped semiconductor layer and side walls of the first and second insulation films;

sequentially forming a dielectric thin film and a second electrode insulating film on the first electrode film.

16. The semiconductor device capacitor fabrication method of claim 15, further comprising:

removing the second insulation film before sequentially forming the dielectric thin film and the second electrode insulating film on the first electrode film.

17. The semiconductor device capacitor fabrication method of claim 15, wherein the exposing comprises:

forming the first insulation film on the semiconductor substrate;

forming the undoped semiconductor layer on the first insulation film; and forming the second insulation film on the undoped semiconductor layer.

18. The semiconductor device capacitor fabrication method of claim 17, wherein the exposing further comprises:

patterning the undoped semiconductor layer, where the second insulation film is formed on selective portions of the patterned undoped semiconductor layer.

19. The semiconductor device capacitor fabrication method of claim 15, further comprising:

forming a poly-morphic silicon layer on the side walls of each of the first insulation film and the an undoped semiconductor layer after the etching, the poly-morphic silicon layer being positioned between the first electrode film and the side walls of each of the first insulation film and the an undoped semiconductor layer.

20. The semiconductor device capacitor fabrication method of claim 19, further comprising:

rapid thermal annealing (RTA) the poly-morphic silicon layer after the formation thereof, wherein the poly-morphic silicon layer includes a doped polysilicon layer.

* * * * *